United States Patent
Stefanoski et al.

(10) Patent No.: US 7,154,749 B2
(45) Date of Patent: Dec. 26, 2006

(54) SYSTEM FOR EFFICIENTLY COOLING A PROCESSOR

(75) Inventors: Zoran Stefanoski, Menlo Park, CA (US); Jeong H. Kim, Hayward, CA (US)

(73) Assignee: NVIDIA Corporation, Santa Clara, CA (US)

(*) Notice: Subject to any disclaimer, the term of this patent is extended or adjusted under 35 U.S.C. 154(b) by 207 days.

(21) Appl. No.: 10/863,103

(22) Filed: Jun. 8, 2004

(65) Prior Publication Data

US 2005/0270739 A1   Dec. 8, 2005

(51) Int. Cl.
*H05K 7/20* (2006.01)
*F28D 15/00* (2006.01)

(52) U.S. Cl. .............. 361/695; 165/80.3; 165/104.33; 361/700

(58) Field of Classification Search ........... 165/104.33; 361/700
See application file for complete search history.

(56) References Cited

U.S. PATENT DOCUMENTS

| | | | | |
|---|---|---|---|---|
| 6,152,213 A * | 11/2000 | Suzuki | ............ | 165/104.33 |
| 6,357,515 B1 * | 3/2002 | Bhatia | ............ | 165/80.3 |
| 6,450,250 B1 * | 9/2002 | Guerrero | ............ | 165/104.33 |
| 6,633,484 B1 * | 10/2003 | Lee et al. | ............ | 361/697 |
| 6,830,098 B1 * | 12/2004 | Todd et al. | ............ | 165/104.33 |
| 2003/0205363 A1 * | 11/2003 | Chu et al. | ............ | 165/80.3 |
| 2004/0188065 A1 * | 9/2004 | Shook et al. | ............ | 165/80.4 |

* cited by examiner

*Primary Examiner*—Gregory D Thompson
(74) *Attorney, Agent, or Firm*—Patterson & Sheridan, L.L.P.

(57) ABSTRACT

One embodiment of a system for efficiently cooling a processor includes a mounting plate configured to be thermally coupled to the processor, a passive heat transport device thermally coupled to the mounting plate and a heat exchanger coupled to the passive heat transport device.

13 Claims, 3 Drawing Sheets

SYSTEM FOR EFFICIENTLY COOLING A PROCESSOR

BACKGROUND OF THE INVENTION

1. Field of the Invention

This invention relates generally to computer hardware and relates more particularly to a system for efficiently cooling a processor.

2. Description of the Background Art

FIG. 1 is a schematic diagram illustrating a computing device 100, within which a conventional cooling system 118 for cooling a graphics processing unit (GPU) 116 is incorporated. As shown, computing device 100 includes a housing 101, within which a motherboard 104 resides. Mounted on motherboard 104 are a central processing unit (CPU) 106, a processor cooler 108 for cooling CPU 106, a system fan 110 for removing heat from computing device 100 and one or more peripheral component interface (PCI) cards 112, each interfaced with a slot located in the back part of housing 101. Motherboard 104 further incorporates a graphics card 102 that enables computing device 100 to rapidly process graphics related data for graphics intensive applications such as gaming applications. Graphics card 102 comprises a printed circuit board (PCB) upon which a plurality of circuit components (not shown), such as memory chips and the like, are mounted. In addition, graphics card 100 includes GPU 116, mounted to one face of graphics card 102, for processing graphics related data.

Because the computational requirements of GPU 116 are typically quite substantial, GPU 116 tends to generate a large amount of heat during operation. If the generated heat is not properly dissipated, the performance of GPU 116 typically degrades. For this reason, cooling system 118, which is configured to remove heat from GPU 116, is coupled to GPU 116. Although not shown in FIG. 1, cooling system 118 typically includes a dedicated fan configured to force air through a plurality of air channels disposed along a surface of cooling system 118 that is coupled to GPU 116 (also referred to as the "heat transfer surface area") and into an outside environment. The air flow through these channels causes the heat generated by GPU 116 to be dissipated into the outside environment.

One drawback to using cooling system 118 is that the size of cooling system 118 is limited by envelope constraints. Specifically, the surface area of graphics card 102 that is allotted to cooling system 118 is limited, and accelerated graphics processor (AGP) chip specifications further restrict cooling system size by curtailing the height of cooling system 118 off of graphics card 102. Size constraints on cooling system 118 limit the size of the heat transfer surface area of cooling system 118 and the size of the dedicated fan, thereby limiting the heat transfer effectiveness of cooling system 118.

Another drawback is that the size of the dedicated fan within cooling system 118 is also limited by envelope constraints, thereby limiting airflow over the heat transfer surface area of cooling system 118 and further inhibiting the heat transfer effectives of cooling system 118.

Yet another drawback of cooling system 118 is that the failure rate of the dedicated fan may be quite high. Since cooling system 118 typically is a component of graphics card 102, failure of the dedicated fan usually necessitates replacing graphics card 102. This requirement not only decreases the reliability of graphics card 102, but also is costly and time consuming.

In addition, during operation the dedicated fan tends to produce a substantial amount of unwanted acoustic noise, which is annoying to users of computing device 100.

SUMMARY OF THE INVENTION

One embodiment of a system for cooling a processor includes a mounting plate configured to be thermally coupled to the processor, a passive heat transport device thermally coupled to the mounting plate and a heat exchanger thermally coupled to the passive heat transport device.

One advantage of the disclosed cooling system is that it uses the system fan of a computing device to draw air through the heat exchanger, thereby eliminating the need for a dedicated fan. Further, using the system fan, as opposed to a dedicated fan, also increases airflow through the disclosed cooling system. This, combined with an increased heat transfer area, substantially improves the heat transfer effectiveness of the disclosed system.

DETAILED DESCRIPTION OF THE INVENTION

Figure 2:
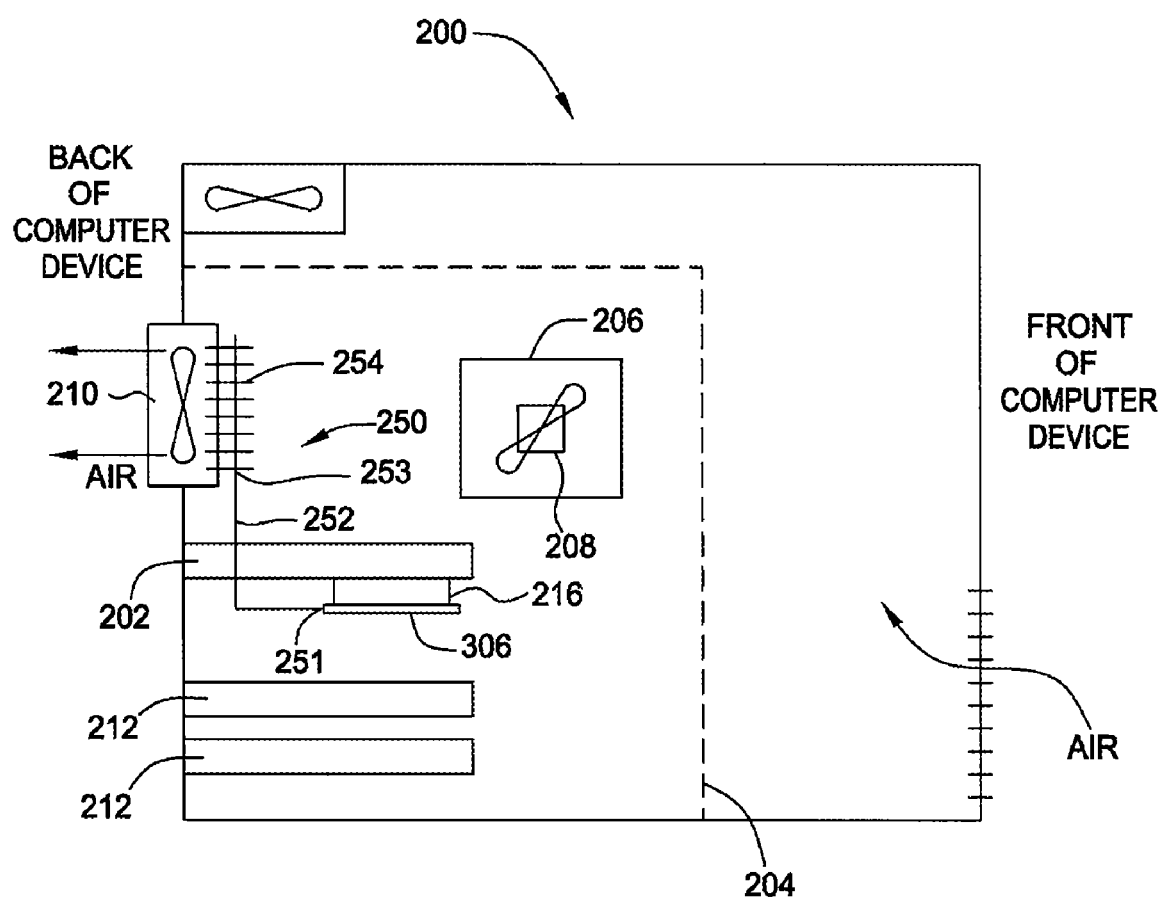
FIG. 2 is a schematic diagram illustrating a computing device, within which an improved cooling system for cooling a graphics processing unit is incorporated, according to one embodiment of the present invention.

FIG. 2 is a schematic diagram illustrating a computing device 200, within which an improved cooling system 250 for cooling a graphics processing unit (GPU) 216 is incorporated, according to one embodiment of the present invention. Computing device 200 may be any type of computing device, including, without limitation, a desktop computer, server, laptop computer, palm-sized computer, personal digital assistant, tablet computer, game console, cellular telephone, computer-based simulator and the like.

Figure 1:
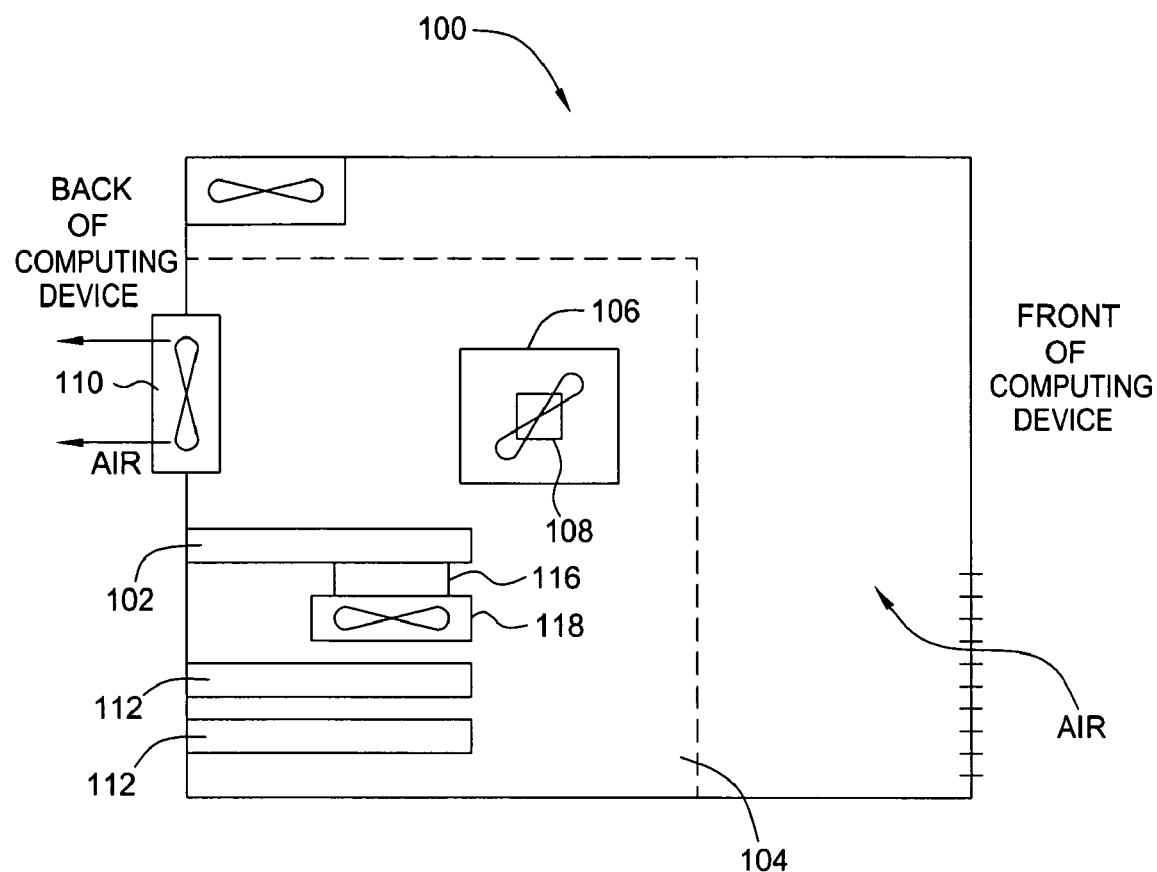
FIG. 1 is a schematic diagram illustrating a computing device, within which a conventional cooling system for cooling a graphics processing unit is incorporated.

Generally, cooling system 250 is configured to be coupled to GPU 216 in lieu of a conventional cooling system, such as cooling system 118 of FIG. 1, and includes, without limitation, a mounting plate (not shown), a passive heat transport device 252 and a heat exchanger 254. Passive heat transport device 252 is coupled at a first end 251 to GPU 216 and is adapted to extend away from GPU 216 in a direction toward system fan 210. As described in further detail below in conjunction with FIG. 3, passive heat transport device 252 may be coupled to GPU 216 using the mounting plate. In one embodiment, passive heat transport device 252 is routed towards system fan 210 through a cut-out in graphics card 202. In an alternative embodiment, passive heat transport device 252 may be routed towards system fan 210 by "looping" passive heat transport device 252 around an edge of graphics card 202. Heat exchanger 254 is coupled to a second end 253 of passive heat transport device 252 and is further adapted to interface with system fan 210.

As also described in further detail below in conjunction with FIG. 3, during operation, heat generated by GPU 216 is transferred to first end 251 of passive heat transport device 252. The heat is then transported along the length of passive heat transport device 252 to second end 253, where the heat is transferred to heat exchanger 254. System fan 210 then draws air through heat exchanger 254, causing the heat transferred to heat exchanger 254 to dissipate through the back of computing device 200, into the outside environment. Importantly, cooling system 250 removes heat generated by GPU 216 with system fan 220, thereby eliminating the need for a dedicated fan.

Those skilled in the art will appreciate that the invention is not limited by the relative locations of graphics card 202 and system fan 210 illustrated in FIG. 2. Graphics card 202 and system fan 210 may have any relative locations, so long as cooling system 250 is able to function as intended.

Figure 3:
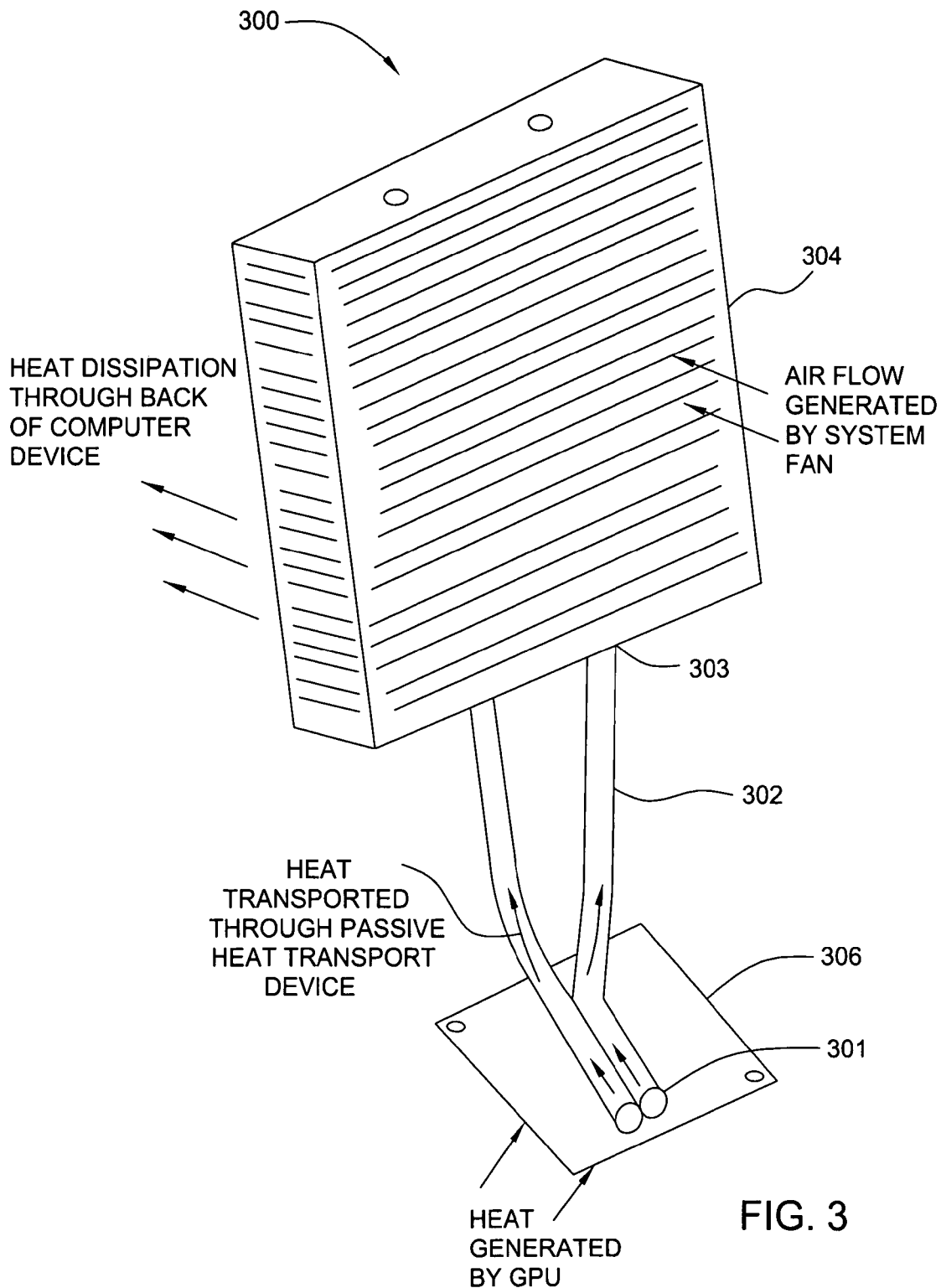
FIG. 3 is an isometric view illustrating one embodiment of an improved cooling system, according to the present invention.

FIG. 3 is an isometric view illustrating one embodiment of an improved cooling system 300, according to the present invention. Similar to cooling system 250 of FIG. 2, cooling system 300 may be adapted for use in any type of appropriate computing device. As shown, cooling system 300 may include, without limitation, a mounting plate 306, a passive heat transport element 302 and a heat exchanger 304. In one embodiment, mounting plate 306 is adapted to be coupled to a GPU, such as GPU 216 of FIG. 2, with care being taken to ensure adequate thermal and mechanical contact between mounting plate 306 and the GPU. In an alternative embodiment, mounting plate 306 may be coupled to both the GPU and to one or more memory chips mounted on the PCB. In yet another embodiment, cooling system 300 may comprise a second mounting plate (not shown), wherein mounting plate 306 is coupled to the GPU and the second mounting plate is coupled to a memory chip.

Passive heat transport device 302 is coupled at a first end 301 to mounting plate 300. In the embodiment illustrated in FIG. 3, passive heat transport device 302 comprises a pair of heat pipes. In alternative embodiments, passive heat transport device 302 may comprise any type of heat transport device that will enable cooling system 300 to operate as intended. For example, passive heat transport device 302 may comprise a thermo-siphon, a heat pipe or any device that can transfer heat from one location to another without using moving parts.

Heat exchanger 304 is coupled to a second end 303 of passive heat transport device 302 and is adapted to interface with the system fan of a computing device, such as system fan 210 of FIG. 2. In the embodiment illustrated in FIG. 3, the heat exchanger 304 comprises a plurality of stacked fins. In alternative embodiments, the heat exchanger 304 may comprise an extrusion, skived or cast heatsink, among others, or may comprise a plurality of plate fins individually mounted, for example, by bonding or press fitting, directly to second end 303 of passive heat transport device 302. In yet another alternative embodiment, passive heat transport device 302 and heat exchanger 304 may be formed as one integrated unit.

Cooling system 300 offers several advantages over conventional cooling systems, such as cooling system 118 of FIG. 1. First, using the system fan in lieu of a dedicated fan results in a more reliable cooling system 300, because the system fan is far more robust, and less prone to failure, than a typical dedicated fan.

In addition, using the system fan increases the cooling capacity of cooling system 300, which enables cooling system 300 to transfer heat away from the GPU more efficiently than conventional cooling systems. One reason for this increase is that the heat transfer area, A, of heat exchanger 304 can be substantially larger than the heat transfer area of a conventional cooling system, since the size of heat exchanger 304 is not limited by envelope constraints typically associated with graphics cards (because cooling system 300 is no longer part of a graphics card). For example, the heat transfer area of heat exchanger 304 may be configured to be upwards of approximately 60 to 350 percent larger than the heat transfer area of conventional cooling system 118 of FIG. 1. Furthermore, the heat transfer coefficient h for cooling system 300 is larger than the heat transfer coefficient for a conventional cooling system, because cooling system 300 relies on the much larger system fan, which generates far greater air flow than typical dedicated fans used with conventional cooling systems.

Heat flow rate $\dot{Q}$ is calculated according to the following equation:

$$\dot{Q} = hA(T_{sink} - T_{air}) \tag{EQN. 1}$$

where, $T_{sink}$ is the temperature of the heat exchanger element of the cooling system and $T_{air}$ is the temperature of the air flowing through the heat exchanger. As discussed above, since A and h are much larger for cooling system 300 than for a conventional cooling system (and if $\Delta T$ is approximately the same), the heat flow rate $\dot{Q}$ is substantially increased when using cooling system 300. The increased heat flow rate $\dot{Q}$ further results in cooling system 300 having an improved heat transfer efficiency, $\Theta_{sa}$, relative to conventional cooling systems. As persons skilled in the art will recognize, heat transfer efficiency, $\Theta_{sa}$, may be calculated according to the following equation:

$$\theta_{sa} = \frac{(T_{sink} - T_{air})}{(\dot{Q})} (°C/watt) \tag{EQN. 2}$$

where, a smaller value for $\Theta_{sa}$ indicates increased efficiency and therefore is more desirable. Again, the larger heat transfer area, A, and heat transfer coefficient, h, cause cooling system 300 to have a greater heat flow rate, $\dot{Q}$, and, consequently, an improved efficiency as well (as evidenced by the smaller value of $\Theta_{sa}$). Or, where $\dot{Q}$ is fixed, the improved efficiency will result in lower $T_{sink} - T_{air}$.

Simulations comparing improved cooling system 300 with a conventional cooling system show that improved cooling system 300 may be approximately three times more efficient than the conventional cooling system. In addition, simulations also show that improved cooling system 300 can cool a GPU to temperatures that are upwards of 25% percent lower than temperatures achieved with the conventional cooling system, for a fixed $\dot{Q}$.

Finally, because cooling system 300 does not include a dedicated fan and generally has fewer moving parts, cooling system 300 produces substantially less noise than a conventional cooling system.

In addition to the foregoing, persons skilled in the art will understand that, in alternative embodiments, cooling system 300 may be used to cool any type of processor. For example, in one embodiment, cooling system 300 may be used to cool a central processing unit. In an alternative embodiment, cooling system 250 is used to cool an application-specific integrated circuit (ASIC).

Thus, the present invention represents a significant advancement in the field of processor cooling. By enabling a greater flow of heat away from the GPU, a system incorporating the improved cooling system described herein will dissipate heat with greater efficiency than prior art cooling system designs. Furthermore, by relying on a system fan to draw air over a heat transfer surface, in lieu of a dedicated fan, the improved cooling system functions with heightened reliability. In addition, the reduction or elimination of moving parts in the improved cooling system will substantially reduce the amount of noise produced during operation.

Although the invention has been described above with reference to specific embodiments, persons skilled in the art will understand that various modifications and changes may be made thereto without departing from the broader spirit and scope of the invention as set forth in the appended claims. The foregoing description and drawings are, accordingly, to be regarded in an illustrative rather than a restrictive sense.

What is claimed is:

1. A system for cooling the interior space of a housing unit of a computing device including a motherboard supporting a central processing unit (CPU) cooled by a fan in a wall of the housing unit and a graphics card mounted substantially perpendicular to the motherboard and supporting a graphics processing unit (GPU) and a memory chip, the cooling system comprising:
   a passive heat transport device having a first end and a second end, the first end including a mounting plate that is directly coupled to the GPU; and
   a heat exchanger coupled to the second end of the passive heat transport device and physically mounted between the central processing unit and the fan in the wall of the housing unit, wherein the heat exchanger is thermally interfaced with the fan, the fan thereby removing the heat generated by the CPU and the GPU.

2. The system of claim 1, wherein the passive heat transfer device comprises a heat pipe.

3. The system of claim 1, wherein the passive heat transfer device comprises a thermo-siphon.

4. The system of claim 1, wherein the passive heat transfer device comprises an electro-kinetic pump.

5. The system of claim 1, wherein the passive heat transport device and the heat exchanger comprise a single integrated element.

6. The system of claim 1, wherein the heat exchanger is an extrusion heatsink.

7. The system of claim 1, wherein the heat exchanger is a stacked fin heatsink.

8. The system of claim 1, wherein the heat exchanger is a skived heatsink.

9. The system of claim 1, wherein the heat exchanger is a cast heatsink.

10. The system of claim 1, wherein the heat exchanger comprises a plurality of plate fins coupled to the passive heat transport device.

11. The system of claim 1, wherein the fan in the wall of the housing unit is a system fan, and the heat-exchanger is adapted to be physically coupled to the system fan.

12. A computing device, comprising:
    a housing unit having a motherboard supporting a central processing unit (CPU);
    a system fan disposed in a wall of the housing unit and configured to cool the CPU;
    a graphics card mounted substantially perpendicular to the motherboard and supporting a graphics processing unit (GPU) and a memory chip; and
    a system for cooling the GPU that includes:
    a passive heat transport device having a first end and a second end, the first end thermally coupled to the CPU, and
    a heat exchanger thermally coupled to the second end of the passive heat transport device and interfaced to the system fan of the computing device and physically mounted between the central processing unit and the system fan in the wall of the housing unit, wherein the heat exchanger is thermally interfaced with the system fan, the system fan thereby removing the heat generated by the CPU and the GPU.

13. The system of claim 12, wherein the system fan is used to draw air through the heat exchanger, causing heat generated by the processor to be dissipated into an outside environment.

* * * * *